(12) United States Patent
Kai

(10) Patent No.: US 7,538,584 B2
(45) Date of Patent: May 26, 2009

(54) SENSE AMPLIFIER

(75) Inventor: Nobuhiro Kai, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 94 days.

(21) Appl. No.: 11/712,465

(22) Filed: Mar. 1, 2007

(65) Prior Publication Data
US 2007/0205808 A1    Sep. 6, 2007

(30) Foreign Application Priority Data
Mar. 2, 2006    (JP)    ............................. 2006-055984

(51) Int. Cl.
*G01R 19/00*   (2006.01)
*G11C 7/00*    (2006.01)
*H03F 3/45*    (2006.01)

(52) U.S. Cl. ........................... 327/51; 327/52; 365/205; 365/207

(58) Field of Classification Search ............. 327/51–57; 365/185.2–185.23, 185.09, 185.25, 205, 365/207
See application file for complete search history.

(56) References Cited

U.S. PATENT DOCUMENTS

| 6,813,207 | B2 * | 11/2004 | Honda | 365/205 |
| 7,145,811 | B2 * | 12/2006 | Ohsawa | 365/189.05 |
| 7,158,402 | B2 * | 1/2007 | Houston | 365/154 |

FOREIGN PATENT DOCUMENTS

| JP | 08-077779 | 3/1996 |
| JP | 2004-206860 | 7/2004 |

* cited by examiner

*Primary Examiner*—Quan Tra
*Assistant Examiner*—Colleen O'Toole
(74) *Attorney, Agent, or Firm*—Studebaker & Brackett PC; Donald R. Studebaker

(57) ABSTRACT

The present invention provides a sense amplifier including a current sense circuit that outputs a detection voltage corresponding to an electric current intended for comparison, a current sense circuit that outputs a reference voltage corresponding to an electric current for reference, and a comparison circuit that compares the detection voltage and the reference voltage and outputs the result of comparison thereby. In the sense amplifier, the current sense circuit is operated in accordance with a chip control signal, and the current sense circuit is operated by a delay chip control signal obtained by delaying the chip control signal by a predetermined time by means of a delay circuit. Thus, since the current sense circuit outputs a predetermined reference voltage when the operation of the current sense circuit is started, the detection voltage rapidly converges on a predetermined level without performing such a feedback operation as to repeat its abrupt rise and fall.

4 Claims, 3 Drawing Sheets

SENSE AMPLIFIER

BACKGROUND OF THE INVENTION

The present invention relates to a sense amplifier which detects an electric current flowing through a selected memory cell to read data written therein.

As a conventional sense amplifier, there is known one which detects an electric current flowing through a memory cell selected in, for example, a ROM (Read Only Memory) thereby to read data written therein. This sense amplifier comprises a current sense circuit which detects an electric current that flows through each of memory cell arrays arranged in matrix form, a current sense circuit for comparison, which detects an electric current flowing through a memory cell array for comparison, and a comparator or comparison circuit.

Both of patent documents 1 (Japanese Unexamined Patent Publication No. Hei 8(1996)-77779) and 2 (Japanese Unexamined Patent Publication No. 2004-206860) disclose a current detection type sense amplifier. Particularly described in the patent document 2 is a read circuit aimed at reading data at high speed and low current consumption by selecting a memory cell when a clock signal is "H" and varying a reference voltage according to data of the selected memory cell when the clock signal is "L".

In the conventional sense amplifiers of the patent documents 1 and 2 and the like, however, the electric currents that flow through the current sense circuit, the current sense circuit for comparison and the comparison circuit are cut off using a chip selection signal upon a standby state with a view toward reducing current consumption. Therefore, when the sense amplifier is switched to its normal operating state by the chip selection signal, there is a need to counterbalance the two current sense circuits and provide the time required to reach a proper operating state of the sense amplifier.

SUMMARY OF THE INVENTION

With the foregoing in view, it is an object of the present invention to shorten the time required for a current detection type sense amplifier to transition from a standby state to an operating state.

According to one aspect of the present invention, for attaining the above object, there is provided a sense amplifier comprising a first current sense circuit that detects an electric current targeted for comparison and outputs a detection voltage corresponding to the electric current, a second current sense circuit that detects an electric current defined as the reference and outputs a reference voltage corresponding to the electric current, and a comparison circuit that compares the detection voltage and the reference voltage and outputs a result of comparison by the comparison circuit. The first and second current sense circuits in the sense amplifier are configured as follows.

The first current sense circuit is activated based on a delay signal. The second current sense circuit is activated based on an operation enabling signal. Therefore, there is provided a delay circuit, which delays the operation enabling signal and thereby outputs the delay signal.

In the present invention, the activation of the first current sense circuit is controlled by the delay signal delayed from the operation enabling signal. Accordingly, the second current sense circuit is operated by the operation enabling signal to generate the predetermined reference voltage. After its generation, the first sense circuit is activated. Thus, since a detection voltage of a first node quickly converges on a predetermined level without doing such a feedback operation as to repeat its abrupt rise and fall, an advantageous effect is brought about in that the time necessary for transition from a standby state to an operating state can be shortened.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

A first current sense circuit is controlled in activation based on a delay signal obtained by delaying an operation enabling signal. It is thus possible to further shorten the time necessary for transition from a standby state to an operating state.

The above and other objects and novel features of the present invention will become more completely apparent from the following descriptions of preferred embodiments when the same is read with reference to the accompanying drawings. The drawings, however, are for the purpose of illustration only and by no means limitative of the invention.

First Preferred Embodiment

Figure 2:
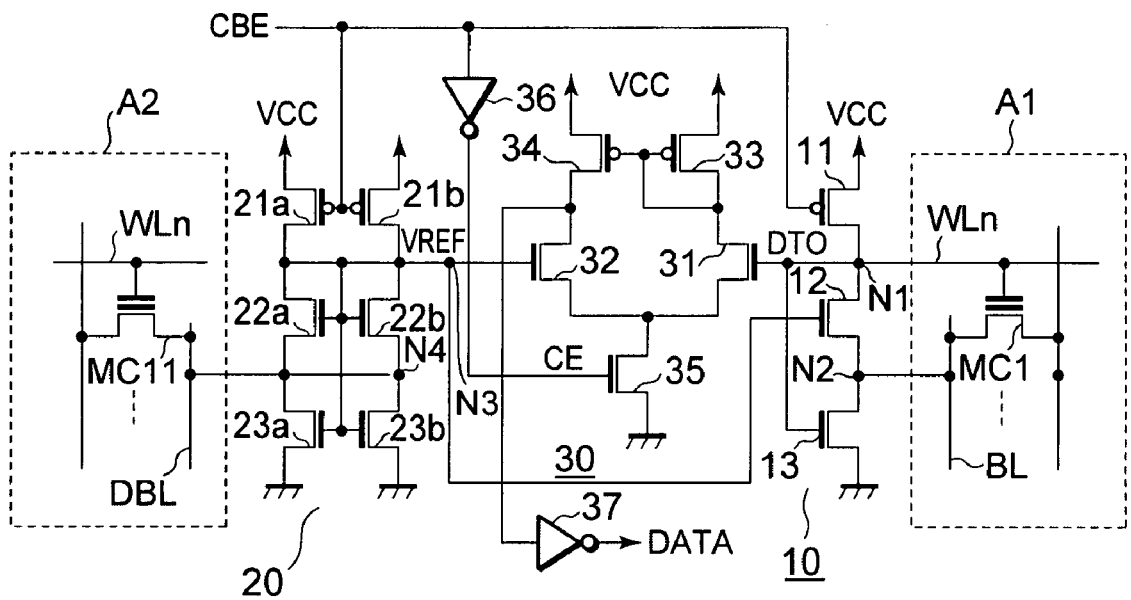
FIG. 2 is a circuit diagram of a sense amplifier having a standby function.

FIG. 2 is a circuit diagram of a sense amplifier having a standby or holding function.

Memory cell array A1 arranged in the shape of a matrix consists of plural memory cell. Each of the memory cells is configured so as to write data therein by controlling the threshold voltage of each individual transistor constituting the memory cell by ion implantation or the like. When each of the memory cells is selected by its corresponding word line WLn, the ion non-implanted memory cell is set so as to be brought to on (e.g., data "1") and the ion-implanted memory cell is set so as to be brought to off (e.g., data "0"). Thus, if a memory cell MC1 selected by the word line WLn is set to on, then an electric current flows into the corresponding bit line BL.

On the other hand, a memory cell array A2 for comparison is constituted of transistors whose threshold voltages are not controlled (which are not subjected to ion implantation). An electric current always flows from a memory cell MC11 selected by the corresponding word line WLn common to the memory cell array A1 to a dummy bit line DBL.

A current sense circuit 10 converts the electric current flowing through the bit line BL of the memory cell array A1 to its corresponding voltage and outputs the same as a detection voltage DTO. The current sense circuit 10 comprises a P channel MOS transistor (hereinafter called "PMOS") 11 disposed in series between a power-supply potential source and a ground potential source, and N channel MOS transistors (hereinafter called "NMOSs") 12 and 13. One electrode of the PMOS 11 is supplied with a power supply voltage VCC, whereas the other electrode thereof is connected to a node N1. The NMOS 12 is connected between the node N1 and a node N2. One electrode of the NMOS 13 is connected to the node N2, whereas the other electrode thereof is supplied with a ground voltage VSS. The node N2 corresponding to a connecting point of the NMOSs 12 and 13 is connected to the bit line BL. The gate of the NMOS 13 is connected to the node N1 corresponding to a connecting point of the PMOS 11 and NMOS 12. The gate of the NMOS 12 is supplied with a reference voltage VREF and the gate of the PMOS 11 is supplied with a chip selection signal CEB. The detection voltage DTO is outputted from the node N1.

A current sense circuit 20 converts the electric current flowing through the bit line DBL of the memory cell array A2 to its corresponding voltage and outputs the same as the reference voltage VREF. The current sense circuit 20 has a PMOS 21$a$ and NMOSs 22$a$ and 23$a$ series-connected between the power-supply potential source and the ground potential source. One electrode of the PMOS 21$a$ is supplied with the power supply voltage VCC, whereas the other electrode thereof is connected to a node N3. The NMOS 22$a$ is connected between the node N3 and a node N4. One electrode of the NMOS 23$a$ is connected to the node N4, whereas the other electrode thereof is supplied with the ground voltage VSS. A PMOS 21$b$ and NMOSs 22$b$ and 23$b$ are respectively parallel-connected to these PMOS 21$a$ and NMOSs 22$a$ and 23$a$. The PMOS 21$b$ and NMOSs 22$b$ and 23$b$ are connected to the PMOS 21$a$ and NMOSs 22$a$ and 23$a$ in such a manner that the voltages supplied to their nodes become identical to those of the PMOS 21$a$ and NMOSs 22$a$ and 23$a$ respectively. Incidentally, the dimensions of gate widths and lengths of the PMOSs 21$a$ and 21$b$ are set to the same dimensions as the PMOS 11. The NMOSs 22$a$ and 22$b$ are set to be identical to the NMOS 12 in dimension, and the NMOSs 23$a$ and 23$b$ are set to be identical to the NMOS 13 in dimension, respectively.

The node N4 corresponding to a connecting point between the NMOSs 22$a$ and 22$b$ and the NMOSs 23$a$ and 23$b$ is connected to the bit line DBL. The gates of these NMOSs 22$a$, 22$b$, 23$a$ and 23$b$ are connected to the node N3 corresponding to a connecting point between the PMOSs 21$a$ and 21$b$ and the NMOSs 22$a$ and 22$b$. The gates of the PMOSs 21$a$ and 21$b$ are supplied with the chip selection signal CEB, and the reference voltage VREF is outputted from the node N3.

A comparison circuit or comparator 30 is constituted of a differential amplifier. The comparator 30 has an NMOS 31 whose conducting state is controlled by the detection voltage DTO supplied from the current sense circuit 10, and an NMOS 32 whose conducting state is controlled by the reference voltage VREF supplied from the current sense circuit 20. The drains of the NMOSs 31 and 32 are respectively supplied with the power supply voltage VCC via PMOSs 33 and 34. The gates of these PMOSs 33 and 34 are connected to the drain of the NMOS 31. The sources of the NMOSs 31 and 32 are connected in common and supplied with the ground voltage VSS via an NMOS 35. The gate of the NMOS 35 is supplied with a chip selection signal CE obtained by inverting the chip selection signal CEB by an inverter 36. An inverter 37 is connected to the drain of the NMOS 32 and outputs data DATA therefrom.

The operation of the sense amplifier will next be described. Incidentally, the ground voltage VSS<reference voltage VREF<power supply voltage VCC is held upon its normal operation (upon an activated state of each sense circuit) in the description thereof.

When the chip selection signal CEB is of a level "H" (power supply voltage VCC level), the present sense amplifier is brought to standby state. When the chip selection signal CEB becomes a level "L" (ground voltage VSS level), the sense amplifier is brought to a normal operating state and hence the operations of the current sense circuits 10 and 20 and the comparator 30 are started.

An electric current I flows through the current sense circuit 10 per se regardless of the electric current that flows from the memory cell array A1. Thus, if the memory cell MC1 connected to the selected word line WLn is in an off state, then the electric current of the NMOS 13 reaches I, whereas if the memory cell MC1 is in an on state, then the electric current is brought to I+Imc (where Imc: electric current flowing through the memory cell held in the on state). Assuming that the resistance values of the NMOSs 12 and 13 are Ra and Rb respectively, the detection voltage DTO at the node N1 becomes IRa+IRb when the memory cell MC1 is in the off state, whereas if the memory cell MC1 is in the on state, then the detection voltage DTO reaches IRa+(I+Imc)Rb.

On the other hand, the electric current Imc flows from the memory cell MC11 of the memory cell array A2 to the current sense circuit 20 regardless of the selected word line WLn. Since the combined resistance value of the NMOSs 22$a$ and 22$b$ is Ra/2 and the combined resistance value of the NMOSs 23$a$ and 23$b$ is Rb/2, the electric current that flows through the current sense circuit 20 per se is 2I. Thus, the reference voltage VREF at the node N3 reaches IRa+(2I+Imc)Rb/2.

Thus, if the selected memory cell MC1 is held in the off state, then the detection voltage DTO is reduced by Imc·Rb/2 compared with the reference voltage VREF. If the selected memory cell MC1 is in the on state, then the detection voltage DTO is raised by Imc·Rb/2 compared with the reference voltage VREF.

In the comparator 30, the detection voltage DTO and the reference voltage VREF are differential-amplified so that data DATA of "L" or "H" is outputted from the inverter 37.

Figure 3:
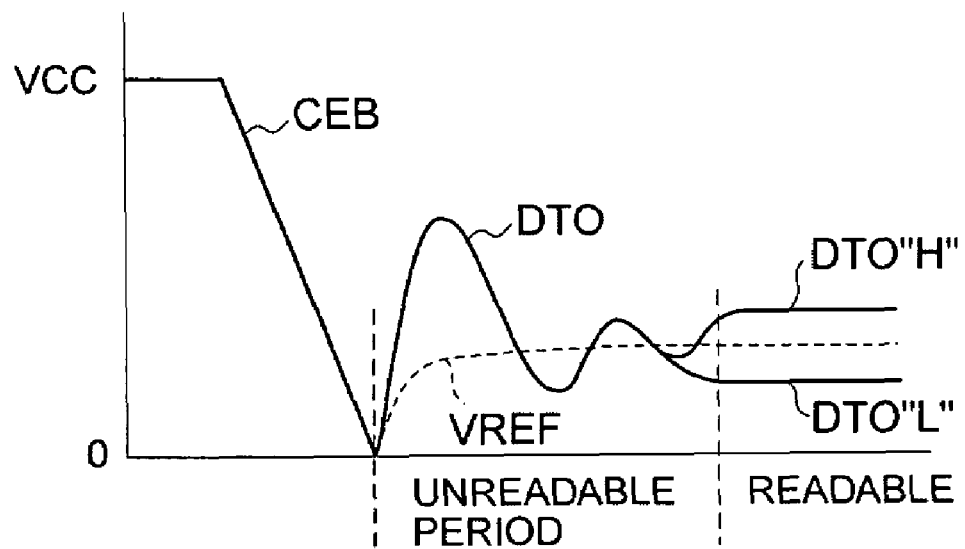
FIG. 3 is a signal waveform diagram of the sense amplifier shown in FIG. 2.

FIG. 3 is a signal waveform diagram of the sense amplifier having the standby function shown in FIG. 2.

Although the detection voltage DTO in its operating state is affected by the reference voltage VREF applied to the gate of the NMOS 12 and the potential of the bit line BL corresponding to its drain, the node N3 to output the reference voltage VREF rises from the ground potential VSS when the sense amplifier changes from the standby state to the operating state, so the NMOS 12 is held in an off state in its initial state. On the other hand, since the chip selection signal CEB applied to the gate of the PMOS 11 becomes "L", the PMOS 11 is brought to an on state so that the potential of the node N1 to output the detection voltage DTO rises. The detection voltage DTO is inputted to the gate of the NMOS 13.

When the sense amplifier changes from the standby state to the operating state and time elapses, the potential of the node N3 applied to the gate of the NMOS 12 rises so that the NMOSs 12 and 13 are respectively brought to an on state. Consequently, such a feedback operation as to reduce or lower the potential of the node N1 is carried out. Thus, the potential corresponding to the detection voltage DTO rises and falls repeatedly and falls into a constant potential as shown in FIG. 3. That is, it means that a certain amount of time is ensured to obtain a normal output in consideration of the fact that the proper data of each memory cell MC1 is not outputted during periods for a rise and fall in the detection voltage DTO.

Figure 1:
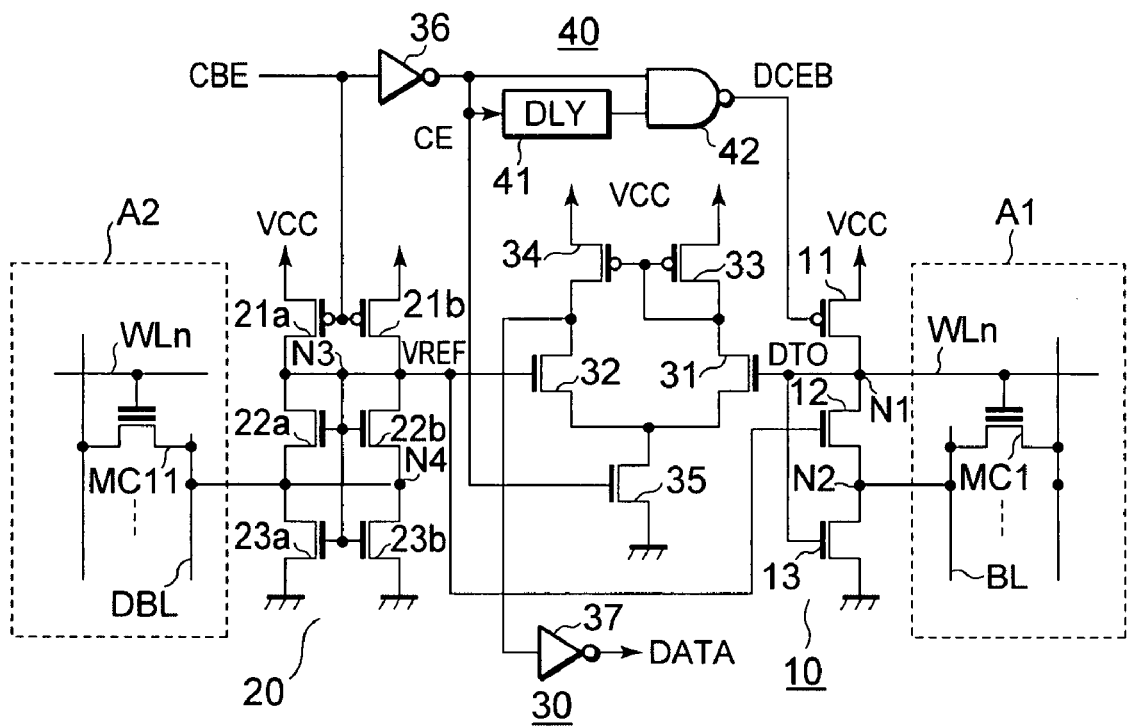
FIG. 1 is a configuration diagram of a sense amplifier showing a first embodiment of the present invention.

Therefore, in the sense amplifier shown in FIG. 1, a delay circuit 40 is added to the sense amplifier shown in FIG. 2.

In FIG. 1, constituent elements common to those shown in FIG. 2 are respectively given common reference numerals.

In a manner similar to FIG. 2, the present sense amplifier detects an electric current flowing through a memory cell selected in a ROM thereby to read data written therein. The sense amplifier shown in FIG. 1 comprises a current sense circuit 10 similar to FIG. 2, which detects an electric current flowing through a memory cell array A1 having an arrangement of matrix form, a current sense circuit 20 similar to FIG. 2, which detects an electric current flowing through a memory cell array A2 for comparison, a comparison circuit or comparator 30 similar to FIG. 2, and the newly-added delay circuit 40.

The delay circuit 40 generates a delay chip selection signal DCEB obtained by delaying a chip selection signal CEB by a predetermined time interval. The delay circuit 40 comprises a delay unit 41 which delays a chip selection signal CE outputted from an inverter 36 by a predetermined time interval, and a NAND gate 42 which outputs the Noting of both an output signal of the delay unit 41 and the chip selection signal CE as the delay chip selection signal DCEB. The delay chip selection signal DCEB outputted from the NAND gate 42 is supplied to the gate of a PMOS 11 of the current sense circuit 10.

That is, the gate of the PMOS 11 in the current sense circuit 10 is supplied with the delay chip selection signal DCEB from the delay circuit 40. Further, the gates of PMOSs 21a and 21b of the current sense circuit 20 are supplied with the chip selection signal CEB.

Figure 4:
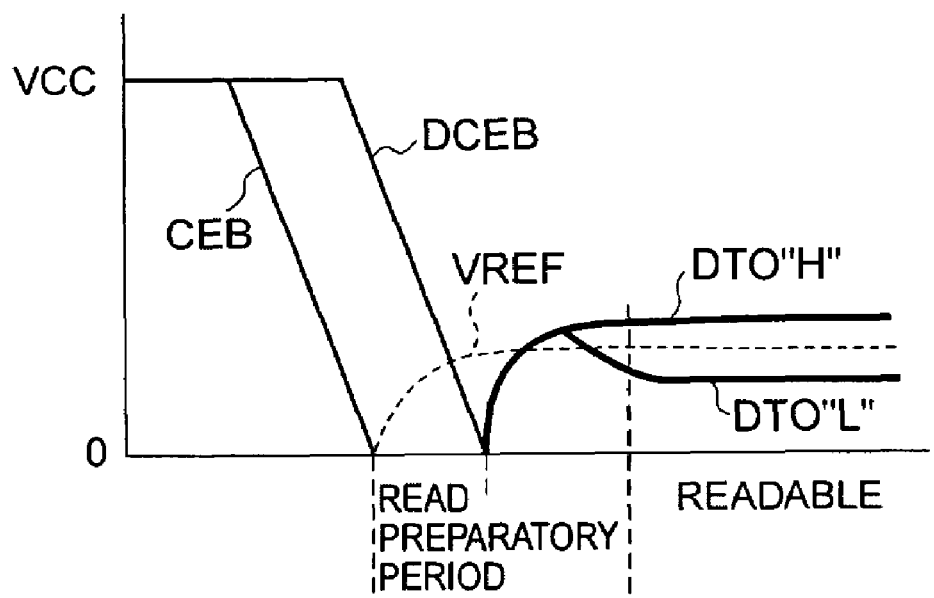
FIG. 4 is a signal waveform diagram of the sense amplifier of FIG. 1 at the start of its operation.

FIG. 4 is a signal waveform diagram of the sense amplifier of FIG. 1 at the start of its operation. The operation of the sense amplifier of FIG. 1 at the time that the chip selection signal CEB changes from "H" to "L" upon the start of its operation, will be explained below with reference to FIG. 4.

When the chip selection signal CEB is "H", the chip selection signal CE outputted from the inverter 36 is "L" and the delay chip selection signal DCEB outputted from the delay circuit 40 is "H". Thus, the PMOS 11 of the current sense circuit 10 is brought to an off state, so that a node N1 to output a detection voltage DTO is held at a ground potential VSS. Further, the PMOSs 21a and 21b of the current sense circuit 20 are also brought to an off state, so that a node N3 to output a reference voltage VREF is also held at the ground voltage VSS.

When the chip selection signal CEB changes from "H" to "L", the chip selection signal CE outputted from the inverter 36 goes "H" whereas the delay chip selection signal DCEB outputted from the delay circuit 40 remains at "H" during the delay time interval set by the delay unit 41. Thus, the PMOS 11 of the current sense circuit 10 is held in an off state and the node N1 to output the detection voltage DTO is at the ground voltage VSS. On the other hand, the PMOSs 21a and 21b of the current sense circuit 20 are respectively brought to an on state so that the node N3 monotonously rises to the predetermined reference voltage VREF. Further, an NMOS 35 of the comparator 30 is brought to an on state so that a differential amplifying operation to be performed by the comparator 30 is started.

When the delay time set by the delay unit 41 elapses, the delay chip selection signal DCEB outputted from the delay circuit 40 changes to "L". Thus, the PMOS 11 of the current sense circuit 10 is brought to an on state so that the operation of the current sense circuit 10 is started. At this time, the predetermined reference voltage VREF is applied to the gate of the NMOS 12 of the current sense circuit 10, and the selected memory cell MC1 of the memory cell array A1 is connected to a node N2. Therefore, the level of the detection voltage DTO at the node N1 rapidly converges on a predetermined level without such a feedback operation as repeat its abrupt rise and fall. Incidentally, the operation of the sense amplifier after the normal operating state is reached is performed in the same manner as conventional.

As described above, the sense amplifier according to the first embodiment shown in FIG. 1 includes the delay circuit 40 for starting the operation of the current sense circuit 10 after the node N3 to output the reference voltage VREF supplied from the current sense circuit 20 to the current sense circuit 10 has risen to a predetermined voltage. Thus, the sense amplifier has the advantage that since the level of the node N1 to output the detection voltage DTO of the current sense circuit 10 rapidly converges on the predetermined level without such a feedback operation as repeat its abrupt rise and fall, the time necessary for transition from the standby state to the operating state can be shortened.

Second Preferred Embodiment

Figure 5:
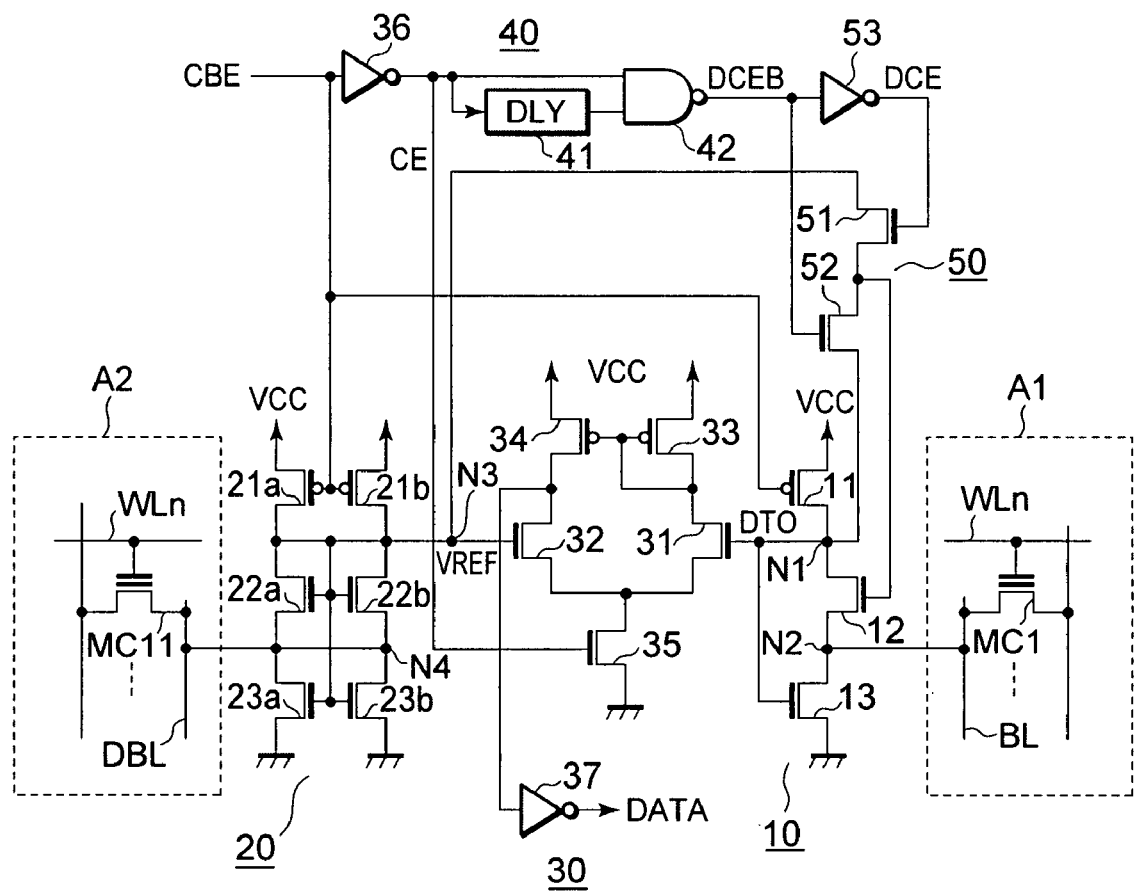
FIG. 5 is a configuration diagram of a sense amplifier showing a second embodiment of the present invention.

FIG. 5 is a configuration diagram of a sense amplifier showing a second embodiment of the present invention. Constituent elements common to those shown in FIG. 1 are respectively given common reference numerals.

The sense amplifier is provided with a switch circuit 50 in addition to current sense circuits 10 and 20, a comparison circuit or comparator 30 and a delay circuit 40 similar to those shown in FIG. 1.

The switch circuit 50 supplies a voltage of a node N3 to output a reference voltage VREF, to the gate of an NMOS 12 of the current sense circuit 10 when a delay chip selection signal DCEB is of "L", and connects the gate of the NMOS 12 to a node N1 when the delay chip selection signal DCEB is of "H". That is, the switch circuit 50 comprises an NMOS 51 connected between the node N3 and the gate of the NMOS 12 and on/off-controlled by the delay chip selection signal DCEB, and an NMOS 52 connected between the node N1 and the gate of the NMOS 12 and on/off-controlled by a delay chip selection signal DCE inverted by an inverter 53. On the other hand, the gate of a PMOS 11 of the current sense circuit 10 is supplied with a chip selection signal CEB in place of the delay chip selection signal DCEB. The sense amplifier is similar in other configuration to one shown in FIG. 1.

Figure 6:
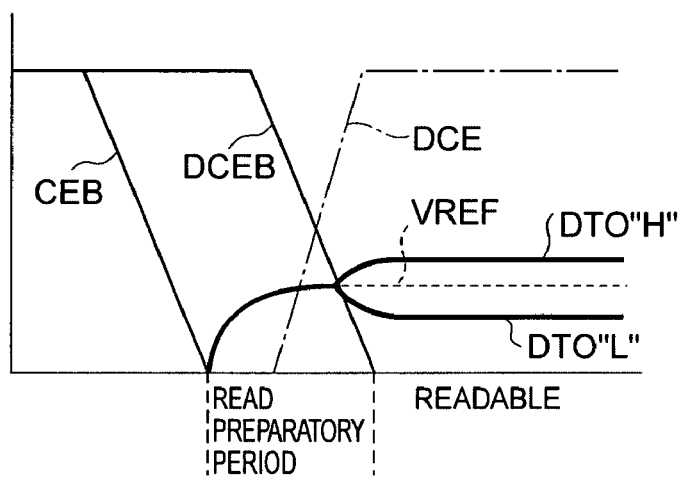
FIG. 6 is a signal waveform diagram of the sense amplifier of FIG. 5 at the start of its operation.

FIG. 6 is a signal waveform diagram of the sense amplifier of FIG. 5 at the start of its operation. The operation of the sense amplifier of FIG. 5 at the time that the chip selection signal CEB changes from "H" to "L" upon the start of its operation, will be explained below with reference to FIG. 6.

When the operation of the sense amplifier is started from its standby state and the chip selection signal CEB is changed from "H" to "L", a chip selection signal CE outputted from an inverter 36 is rendered "H", so that the operations of the current sense circuits 10 and 20 and the comparator 30 are started. However, the delay chip selection signal DCEB outputted from the delay circuit 40 remains at "H" during a delay time interval set by a delay unit 41. Further, the delay chip selection signal DCE is brought to "L". Thus, the NMOS 51 of the switch circuit 50 is off and the NMOS 52 thereof is on, so that the gate of the NMOS 12 is connected to the node N1. Hence, the current sense circuit 10 is brought to the same connection configuration as the current sense circuit 20. Thus, the node N1 to output a detection voltage DTO of the current sense circuit 10 monotonously rises to a predetermined potential in a manner similar to the node N3 to output the reference voltage VREF of the current sense circuit 20.

When the delay time set by the delay unit 41 elapses, the delay chip selection signal DCEB outputted from the delay circuit 40 changes to "L" and the delay chip selection signal DCE is brought to "H". Thus, the NMOS 51 of the switch circuit 50 is turned on and the NMOS 52 thereof is turned off, so that the corresponding reference voltage VREF having a predetermined voltage value is applied to the gate of the NMOS 12 of the current sense circuit 10. Hence, the current sense circuit takes a normal connection configuration. Accordingly, a differential amplifying operation of the comparator 30 is performed and the result of comparison by the comparator 30 is outputted as data DATA.

As described above, the sense amplifier according to the second embodiment shown in FIG. 5 includes the delay circuit 40 and the switch circuit 50 for switching the current sense circuit 10 to the original circuit configuration at that point in time when upon transition of the sense amplifier from the standby state and the operating state, the current sense circuits 10 and 20 are raised with the same timing and the node N3 for outputting the reference voltage VREF and the node N1 for outputting the detection voltage DTO reach the predetermined levels respectively. Thus, the sense amplifier has the advantage that since the level of the node N1 for outputting the detection voltage DTO of the current sense circuit 10 rapidly converges on the predetermined level simultaneously with the reference voltage VREF without performing such a feedback operation as to repeat its abrupt rise and fall, the time necessary for the transition from the standby state to the operating state can further be shortened.

Incidentally, the present invention is not limited to the above embodiments. Various modifications can be made thereto. As examples for such modifications, the following are cited for example.

(a) Although the memory cell arrays A1 and A2 are targeted for a ROM, they can similarly be applied even to memories other than the ROM.

(b) The electric current targeted for comparison is not limited to the electric current that flows from each memory cell of the ROM or the like. The present invention can be applied as a sense amplifier for detecting a difference in current and amplifying it as a voltage.

What is claimed is:

1. A sense amplifier comprising:
a first current sense circuit that is activated based on a delay signal and that detects an electric current targeted for comparison and outputs a detection voltage corresponding to the electric current, wherein the first current sense circuit includes:
a first transistor connected between a power supply potential and a first node from which the detection voltage is outputted, and brought to an on state when the delay signal is supplied,
a second transistor connected between the first node and a second node supplied with the electric current targeted for comparison, and whose conducting state is controlled by a reference voltage, and
a third transistor connected between the second node and a ground potential and whose conducting state is controlled by a potential applied to the first node;
a second current sense circuit that is activated based on an operation enabling signal and that detects an electric current defined as the reference and outputs the reference voltage corresponding to the electric current, wherein the second current sense circuit includes:
a fourth transistor connected between the power supply potential and a third node from which the reference voltage is outputted, and brought to an on state when the operation enabling signal is supplied,
a fifth transistor connected between the third node and a fourth node supplied with the electric current defined as the reference, and whose conducting state is controlled by a potential applied to the third node, and
a sixth transistor connected between the fourth node and the ground potential and whose conducting state is controlled by the potential applied to the third node;
a comparison circuit that compares the detection voltage and the reference voltage and outputs a result of comparison by the comparison circuit; and
a delay circuit that outputs the delay signal obtained by delaying the operation enabling signal.

2. A sense amplifier comprising:
a first current sense circuit that is activated based on a delay signal and that detects an electric current targeted for comparison and outputs a detection voltage corresponding to the electric current, wherein the first current sense circuit includes:
a first transistor connected between a power supply potential and a first node from which the detection voltage is outputted, and brought to an on state when an operation enabling signal is supplied,
a second transistor connected between the first node and a second node supplied with the electric current targeted for comparison, and
a third transistor connected between the second node and a ground potential and whose conducting state is controlled by a potential applied to the first node;
a second current sense circuit that is activated based on the operation enabling signal and that detects an electric current defined as the reference and outputs a reference voltage corresponding to the electric current, wherein the second current sense circuit includes:
a fourth transistor connected between the power supply potential and a third node from which the reference voltage is outputted, and brought to an on state when the operation enabling signal is supplied,
a fifth transistor connected between the third node and a fourth node supplied with the electric current defined as the reference, and whose conducting state is controlled by a potential applied to the third node, and
a sixth transistor connected between the fourth node and the ground potential and whose conducting state is controlled by the potential applied to the third node,
said sense amplifier including a switch circuit for selectively controlling a conducting slate of the second transistor according to the state of the delay signal on the basis of the potential of the first node or the reference voltage;
a comparison circuit that compares the detection voltage and the reference voltage and outputs a result of comparison by the comparison circuit; and
a delay circuit that outputs the delay signal obtained by delaying the operation enabling signal.

3. The sense amplifier according to claim 1, wherein the electric current targeted for comparison is an electric current that flows through a memory cell, and the electric current defined as the reference is an electric current that flows through a dummy cell.

4. The sense amplifier according to claim 2, wherein the electric current targeted for comparison is an electric current that flows through a memory cell, and the electric current defined as the reference is an electric current that flows through a dummy cell.

* * * * *